United States Patent [19]

Batty

[11] Patent Number: 4,894,351

[45] Date of Patent: Jan. 16, 1990

[54] METHOD FOR MAKING A SILICON IC WITH PLANAR DOUBLE LAYER METAL CONDUCTORS SYSTEM

[75] Inventor: Michael W. Batty, Dresher, Pa.

[73] Assignee: Sprague Electric Company, North Adams, Mass.

[21] Appl. No.: 156,048

[22] Filed: Feb. 16, 1988

[51] Int. Cl.$^4$ .................. H01L 21/00; H01L 21/02; B44C 1/22; C03C 15/00

[52] U.S. Cl. ................................ 437/190; 437/195; 437/228; 437/229; 437/231

[58] Field of Search .................... 156/653, 659.1, 654; 437/190, 195, 228, 978, 985

[56] References Cited

U.S. PATENT DOCUMENTS

| | | | |
|---|---|---|---|
| 4,481,070 | 11/1984 | Thomas et al. | 156/643 |
| 4,481,079 | 11/1984 | Thomas et al. | 156/643 |
| 4,654,113 | 3/1987 | Tuchiya et al. | 156/643 |
| 4,676,867 | 6/1987 | Elkins et al. | 156/643 |

OTHER PUBLICATIONS

Chiang C. et al., "Defects Study On Spin On Glass Planarization Technology", V-MIC Conf., IEEE Jun. 15-16, 1987, pp. 404-412.
Elkins P. et al., "A Planarization Process for Double Metal CMOS Using Spin-On-Glass as a Sacrificial Layer", V-MIC Conf., IEEE Jun. 9-10, 1986, pp. 100-106.
Vines L.B. et al., "Interlevel Dielectric Planarization With Spin-On Glass Films", V-MIC Conf., IEEE Jun. 9-10, 1986, pp. 506-515.
Geiger W. et al., "An Optimized Planarization Process for a Multi Layer Interconnect", V-MIC Conf., IEEE Jun. 9-10, 1986, pp. 128-136.
Vasquez B. et al., "Planarized Oxide With Sacrificial Photo-resist: Etch Rate Sensitivity to Pattern Density", V-MIC Conf., IEEE Jun. 15-16, 1987.
Grewal V. et al., "A Novel Multilevel Metallization Technique for Advanced CMOS and Bipolar Integrated Circuits", V-MIC Conf., IEEE Jun. 9 , 1986, pp. 107-113.
Adams et al., "Planarization of Phosphorus-Doped Silicon Dioxide", J. Electrochem Soc.: Solid-State Science and Technology, Feb. 1981, vol. 128, pp. 423-429.
Ghandhi, Sorab K., *VLSI Fabrication Principles*, John Wiley & Sons, pp. 582-585.
Barton et al., "Fine Pitch Two-Level Metal for a 1.3 Micron CMOS Process", Jun. 9-10, 1986 V-MIC Conference, 1986 IEEE, pp. 52-57.
Chu et al., "Spin-On-Glass Dielectric Planarization for Double Metal CMOS Technology", Third International VLSI Multilevel Interconnection Confer. Proceedings, Jun. 9-10, 1986, V-MIC Conf, pp. 474-483.

*Primary Examiner*—Brian E. Hearn
*Assistant Examiner*—B. Everhart

[57] ABSTRACT

A process for providing in an integrated circuit on which there are to be formed at least two levels of metal conductors, includes depositing a first blanket layer of silicon dioxide over the first metal film conductors, spinning on a silicon glass precursor compound carried by an organic vehicle and heat curing to produce a silica coat, covering this sheet by spinning on a layer of photoresist resin and subsequently etching back this stack of insulating layers to leave a thinned but contiguous first silicon dioxide layer, to leave only thick plug portions of the underlying silica coat in deepest recess regions of the underlying silicon dioxide layer and to leave none of the photoresist layer. This presents a particularly smooth surface over which the second pattern of metal conductors may be formed with good step coverage in the metal cross-over regions and, in initially smooth regions at which vias are to be formed, leaves essentially no trace of the sacrificial photoresist resin nor of the partially sacrificial silica coat.

11 Claims, 1 Drawing Sheet

METHOD FOR MAKING A SILICON IC WITH PLANAR DOUBLE LAYER METAL CONDUCTORS SYSTEM

BACKGROUND OF THE INVENTION

This invention relates to a process for making silicon integrated circuits with double metal layers, and more particularly to such a process in which the steps for forming the inter metal layer insulation includes etching back in one step a stack of insulation layers overlying the first metal layer, which stack is composed of a deposited silicon dioxide layer, a spun and cured silica coat and a photoresist layer to provide a nearly planar surface on which to deposit the outer metal layer.

Planarizing processes for forming multiple metal layer conductor systems in integrated circuits have been used for several years. One of the first commercially successful of such processes includes the steps of depositing a first silicon dioxide layer by a standard chemical vapor deposition (CVD) step, spinning on and curing a photoresist and etching back the photoresist and the deposited oxide at about the same rate. The etching is stopped at the point or before the point at which the photoresist is completely removed. The first blanket oxide layer is thinned especially at thick regions but is not penetrated anywhere.

However, poor reproducibility and control was realized arising from the sensitivity of the photoresist etch rate to variations in cure cycle parameters. Also resist coverage is relatively thick and tends to fill in areas of dense metal patterns. Typically such etchbacks must be repeated two or more times to achieve a significant etching and planarizing of the deposited silicon dioxide. Further, photoresists have poor dielectric properties and any residual photoresist that is left in the intermetal layer insulation system degrades the dielectric performance and reliability of the system.

In a more recent double-metal planarization process, illustrated herein in FIGS. 1a, 1b and 1c, the interlayer dielectric between first metal films (22a and 22b) and second metal film 18 is composed of first (12) and second (14) deposited silicon dioxide layers having a layer of spin on glass (16) therebetween. The term "spin on glass" (SOG) is used in the art to mean a spun on coat of an organic liquid precursor of silica that is subsequently heated and transformed to a silica coat, whereas a more accurate term would be "spin on silica". The thickness of the spin on glass, silica coat (16), is lowest over broad or spaced apart first metal runs (22a and 22b), and tends to thicken in the gaps between closely spaced first metal runs (22a and 22b) and to mound over such high density networks of fine-line first metal conductors. The spin on glass 16 is etched back. It is first removed in the thinnest areas and in those areas the etchant removes some of the first deposited oxide layer 12. The etching is stopped only after all the spin on glass is removed. Thus the first deposited oxide layer 12 is planarized to a degree and deposition of second metal 14 is accomplished with better physical integrity of the metal where crossing over first metal runs (22a and 22b). In this process, the spin on glass is used only as a sacrificial layer.

Another and similar double metal planarization process substitutes spin on polyimide between the first and second deposited silicon dioxide layers. Etch-back of the polyimide and first oxide layers is effected in the same fashion except the etching is terminated before all of the polyimide layer is removed. Other and similar double metal planarization processes use the sandwiched spin on glass coat but do not remove all of it.

In the above-described double metal processes, the photoresist, or spin on glass or polyimide in each case is at least partially sacrificed, i.e. removed. In each case, the greater the amount left in the integrated circuit of the sacrificial material, the more planar is the insulation surface on which the second metal layer is to be deposited. On the other hand, residual amounts of organic materials in the otherwise inorganic structure of the integrated circuit is liable to degrade the physical and dielectric properties of the insulation layer with time.

Another limitation on planarizing processes relying upon the use of layers that are sacrificed at an etch-back step, is that the best known sacrificial layer materials such as organic resins and spun on liquid and cured silica coats must be removed entirely in the aforementioned regions of greatest start planarity where vias are to be made for interconnecting the multiple metal films with each other and/or the substrate. Remaining spin on glass is hygroscopic. The water in such glass and the volatized components of the organic vehicle residue at a via cause delamination of the second non-sacrificial insulation layer. Furthermore, aluminum does not adhere well to spin on glass also degrading the integrity of an aluminum filled via.

It is an object of this invention to provide a double metal conductor system in a silicon integrated circuit leading to an improved planarity in the inter metal insulation without leaving sacrificial layer material in the inter metal insulation.

SUMMARY OF THE INVENTION

A method for providing a silicon integrated circuit with two stacked but insulated metal films serving as conductors, includes forming over one side of a silicon substrate a first metal film having two metal portions separated by a gap. Over this first metal film there are deposited a first blanket insulative silicon dioxide layer, a coat of silica over the first blanket insulative layer and a spin on coat of an organic resin. The silica coat may be a spin on glass (SOG) coat.

Using an etching process that is adapted for removing the organic resin, the silica coat material and the first blanket oxide layer material all at about the same rate, an etching step is performed to entirely remove the resin layer, to remove the portions of the silica coat in areas where the coat had been thinnest, and to thin the regions of the first blanket oxide layer where exposed through apertures in the silica coat at which silica-coat portions were removed.

The result of that series of process steps is to provide a relatively planar surface of insulative material over the underlying pattern of first metal. On that surface there may be subsequently deposited yet another blanket insulative layer, e.g. a CVD layer of silicon dioxide, over which a second patterned metal film is formed.

This process for forming a planarized multi-layered insulation system between first and second metal conductor films in an integrated circuit employs two sacrificial layers and one etching step, leading to a low cost high quality double metal conductor system.

This invention recognizes that silica (SOG) coats formed by applying an organic silica precursor in a liquid vehicle and heat curing has a tendency for crackng for coats, e.g. SOG coats, thicker than a few thousand angstroms; namely, greater than about 3000 Å. It is further recognized that, for a given thickness, such silica coats have a high ratio of thickness at regions of dense patterns of first metal to thickness at other regions where the supporting surface is planar such as the other regions of all first metal or no first metal. This later feature is especially desirable when the silica coat is to be used as a partially sacrificial layer in a planarizing etch-back step. On the other hand, that thicknesses ratio for resins such as photoresists and polyimides is smaller, the resins tending to provide a more nearly planar coating because of their characteristically greater coating thickness, e.g. greater than 3000 Å. Therefore, for that reason, resin sacrificial layers are less efficient as a planarizing sacrificial layer.

The combination in the process of this invention provides two sacrificial layers of suitable total thickness without the incidence of cracking since the crack prone silica coat component may now be thinner than in the prior art by at least a factor of 2. This may be accomplished employing only one etch-back step in which all of both sacrificial layers are removed in initially smooth areas where vias may be formed, and in which portions of the silica layer remains in the gaps between adjacent portions of dense first-metal patterns.

DESCRIPTION OF THE PREFERRED EMBODIMENTS

Figure 1A:
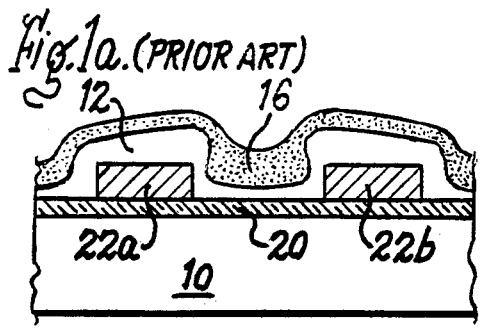
FIGS. 1a, 1b and 1c show side sectional views of a portion of an integrated circuit illustrating respectively three successive stages in a prior art process for forming a double layer metal conductor system therein.

Referring to FIG. 1a, a silicon crystal substrate 10 has grown on one side thereof a layer 20 of silicon dioxide. An aluminum film is deposited over the oxide layer 20. By standard photolithographic steps, portions of the aluminum film are selectively removed leaving at least two spaced apart essentially coplanar aluminum film portions 22a and 22b.

The following series of steps is to provide insulating cover over the sharply relieved pattern of first metal, e.g. aluminum portions 22a and 22b having a film thickness of about ½ micron and a gap therebetween of 2 microns.

Figure 2A:
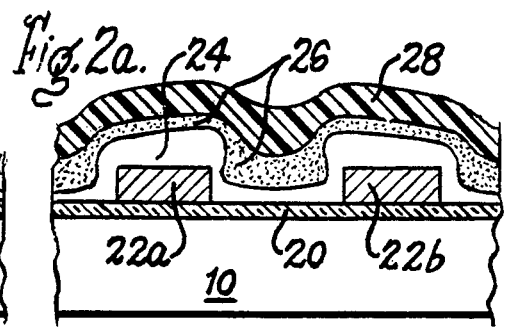
FIGS. 2a, 2b and 2c show side sectional views of a portion of an integrated circuit illustrating respectively three successive stages in a preferred process of this invention for forming a double layer metal conductor system therein.

Referring to FIG. 2a, a layer 24 of silicon dioxide is blanket deposited over the one substrate side by a standard plasma enhanced chemical vapor deposition step. This oxide layer 24 is suitably from 6000 to 8000 angstroms thick.

Next a blanket silica coat 26 of spin on glass is deposited over the oxide layer 24. This is accomplished by the steps of spinning on a coating of siloxane polymer in an organic vehicle and heating at about 400° C. to drive off the organic vehicle and to transfrom the siloxane at least partially, e.g. more than 90% by weight, to silica. Complete conversion of silica is possible at higher cure temperatures but because aluminum melts at 660° C. and other reasons a low SOG cure temperature is greatly preferred. The SOG coat 26 has a tendency to fill in and be thicker at the troughs such as that in the underlying silicon dioxide layer 24 at the gap between the aluminum portions 22a and 22b, and thus has a surface smoothing effect even with an average SOG thickness of about 2000 angstroms.

A blanket photoresist layer 28 is then formed over the SOG layer 26 by the conventional steps of spinning and heat curing. Photoresist layers tend to be substantially thicker and also tend to fill in troughs in the underlying surface, being thickest as seen in FIG. 2a in the vicinity of the metal gap. However, the photoresist layer 28 has about the same average thickness, e.g. 10,000 Å, at substrate areas where there is no metal and where the underlying surface is quite smooth already, whereas the SOG coating has a higher average thickness at regions of dense networks of first metal, represented in FIGS. 2a, 2b and 2c, than its average thickness at regions of low or zero density of the underlying metal networks. A low (zero) density metal network region is illustrated in FIG. 3 where profiles of spin on glass coat 26 and resist layer 28 are to the same vertical scale as that of SOG coat 26 and photoresist layer 28 in the "dense metal network" region of FIG. 2a.

Following the curing of the photoresist layer 28, this stack of photoresist, SOG and silicon dioxide layers is subjected to plasma etching at 700 watts in a 10 Torr stmosphere of helium, $C_2F_6$, $CHF_3$ and $O_2$ being introduced respectively, at 3500, 408, 25 and 25 standard cubic centimeters per minute (sccm). This results in etch rates of plasma-enhanced-chemical-vapor-deposited silicon dioxide, photoresist, and SOG, respectively, of 130 Å/sec, 160 Å and 170 Å/sec. The process parameters have intentionally been adjusted to provide essentially equal etch rates of the photoresist and the SOG, especially with the etch rates of the CVD oxide and SOG being as close as possible. Etching is not terminated until all of the photoresist is removed. The first blanket silicon dioxide layer 24 is thinned, especially at thick regions, but is not penetrated anywhere.

Figure 1B:
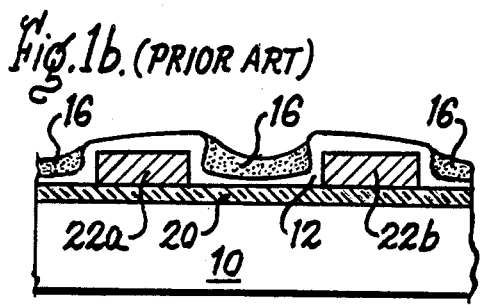
Figure 2B:
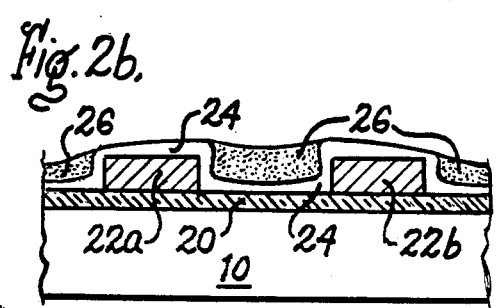
Figure 1C:
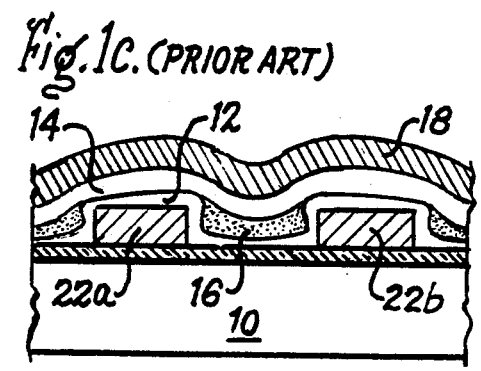
Figure 3:
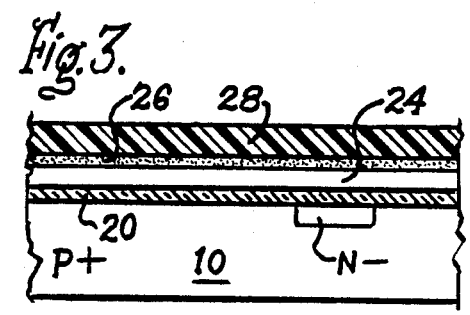
FIG. 3 shows in side sectional view of a portion of the integrated circuit early in the process of FIG. 2a at which there is a region in which no first metal exists.

The resulting outer surface as seen in FIG. 2b is smoother than that of the prior art assembly surface shown in FIG. 1b just after etching. This difference is owing to the photoresist layer 28 that is thicker at regions of discontinuity in the first metal pattern. As has been noted, a thicker coat of SOG, instead of using both a thin SOG layer and a photoresist layer, has serious disadvantages.

Figure 2C:
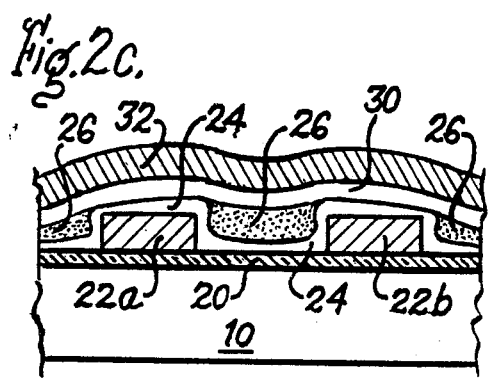

Referring to FIG. 2c, a second blanket deposited silicon dioxide layer 30 is put down by plasma enhanced chemical vapor deposition over the substrate 10 to serve as the principal dielectric layer. Layer 30, being deposited over a relatively smooth surface, is itself essentially uniformly thick, e.g. at 6000–8000 angstroms, and thus the outer (top) surface of silicon dioxide layer 30 is also smooth.

Over this smooth surface a second aluminum film 32 is vacuum deposited. It is then typically photo masked and etched to form a network of conductive aluminum runs having only gradual vertical transitions at points of cross-over with underlying metal runs.

Figure 4:
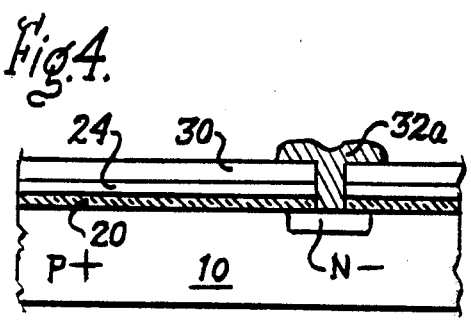
FIG. 4 shows in side sectional view of the further processed integrated circuit of FIG. 2c having a metal contact in a via at the region depicted in FIG. 3.

As has been noted above, the presence of a residual coat of spin on glass in the vicinity of vias through the insulative cover between the two metal layers leads to a degradation in the insulative cover there. In the preferred process of this invention described above and illustrated in FIGS. 2a, 2b, 2c and 4, there is no residual SOG coat in areas of low first metal networks density and formation of vias there results in no such degradation. Such a via, that is filled with a portion 32a of second metal 32, is shown in FIG. 4.

At the same time the preferred process of this invention provides a smoother outer surface of inter metal insulation covering. Specifically, the depression in the SOG at the 2 micron wide gap between two 4 microns thick first metal portions 22a and 22b relative to highest adjacent surfaces of first CVD silicon dioxide 24, all after the etch-back step (as in FIG. 2b), was judged from SEM pictures to be from 1500 to 2500 angstroms deep. Using the above illustrated prior art process (see especially FIG. 1b), the corresponding depression was judged to be from 3000 Å to 5000 Å deep.

What is claimed is:

1. A method for making a silicon integrated circuit with a double metal film system of conductors comprising:
   (a) forming over a side of a silicon substrate a first metal film having one and another portion separated by a gap;
   (b) depositing a first blanket silicon dioxide layer over said substrate side and said first metal film so that the surface of said first layer has a depression at said gap;
   (c) depositing a silica coat directly over said blanket silicon dioxide layer to be thicker at said gap than over said first metal film portions;
   (d) spinning on a layer of an organic resin over said silica coat and curing said resin;
   (e) using an etching process for removing at about the same rate said resin, said silica and said silicon dioxide, etching until said resin coating is entirely removed and until at areas over which said resin layer had been thinnest prior to said etching, said silica coat is removed and the exposed regions of said first blanket silicon dioxide layer are thinned;
   (f) depositing a second silicon dioxide layer, and
   (g) forming over said second silicon dioxide layer a second metal film.

2. The method of claim 1 wherein said depositing a silica coat is comprised of spinning on a liquid coat of siloxane polymer in an organic vehicle and heating to a temperature of from 250° C. to 450° C. to drive off said vehicle and to at least partially transform said liquid coat to silica.

3. The method of claim 1 wherein said etching is continued and stopped only after said silica coat is entirely removed in all areas extending more than 10 microns in all directions wherein said outer surface of said first silicon dioxide layer is essentially planar.

4. The method of claim 3 additionally comprising forming a via hole through said second silicon dioxide layer and through said first silicon dioxide layer at one of said areas over which said resin layer had been thinnest prior to forming said second metal film, said forming said second metal film including filling said via hole with metal contacting said silicon substrate.

5. The method of claim 1 wherein said organic resin is a novalac resin.

6. The method of claim 1 wherein said organic resin is a photoresist.

7. The method of claim 1 wherein said organic resin is a polyimide.

8. The method of claim 1 wherein said first metal film is aluminum or an aluminum alloy.

9. The method of claim 1 wherein said first silicon dioxide layer is accomplished by a plasma enhanced chemical vapor deposition process.

10. The method of claim 1 wherein said forming said second metal film is accomplished by sputtering while heating said substrate to a temperature of from 300° C. to 450° C.

11. The method of claim 1 wherein prior to said etching the average thickness of said silica coat is less than 3000 Å and the thickness of said photoresist layer is greater than 3000 Å.

* * * * *